United States Patent
Linder et al.

(10) Patent No.: US 6,198,123 B1
(45) Date of Patent: *Mar. 6, 2001

(54) SHIELDED INTEGRATED CIRCUIT CAPACITOR CONNECTED TO A LATERAL TRANSISTOR

(75) Inventors: William J. Linder, Golden Valley; Robert S. Harguth, Ham Lake, both of MN (US)

(73) Assignee: Cardiac Pacemakers, Inc., St. Paul, MN (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/924,456

(22) Filed: Aug. 29, 1997

(51) Int. Cl.[7] ................................................. H01G 4/28
(52) U.S. Cl. .......................... 257/306; 257/298; 257/299; 257/300; 257/301; 257/302; 257/303; 257/304; 257/305; 257/327
(58) Field of Search ................................. 257/298–301, 257/302–305, 306–317, 324

(56) References Cited

U.S. PATENT DOCUMENTS

| | | | |
|---|---|---|---|
| 4,700,457 | * 10/1987 | Matsukawa | 257/306 |
| 5,016,070 | * 5/1991 | Sundaresan | 257/302 |
| 5,057,886 | * 10/1991 | Riemenschneider et al. | 257/324 |
| 5,201,991 | * 4/1993 | Lee | 257/296 |
| 5,220,483 | 6/1993 | Scott | 361/313 |
| 5,382,817 | 1/1995 | Kashihara et al. | 257/295 |
| 5,687,056 | * 11/1997 | Harshe et al. | 257/303 |

FOREIGN PATENT DOCUMENTS

| | | |
|---|---|---|
| 0324036 | 7/1989 | (EP) . |
| 0638932 | 2/1995 | (EP) . |
| 0698927 | 2/1996 | (EP) . |
| 0764986 | 3/1997 | (EP) . |
| 60-214551 | 10/1985 | (JP) . |
| 60-224244 | 11/1985 | (JP) . |
| 05047767 | 2/1993 | (JP) . |

OTHER PUBLICATIONS

IBM Technical Disclosure Bulletin, vol. 26, No. 3B, N.Lu, Aug. 1993.*

* cited by examiner

Primary Examiner—Fetsum Abraham
(74) Attorney, Agent, or Firm—Schwegman, Lundberg, Woessner & Kluth, P.A.

(57) ABSTRACT

An integrated circuit (IC) capacitor offers reduced sensitivity to parasitic capacitance, reduced-size, and increased noise immunity, such as for use in digital-to-analog converters (DACs), analog-to-digital converters (ADCs), switched-capacitor filters, and other IC circuits. The capacitor includes a first polysilicon layer, a superjacent second polysilicon layer separated from the first polysilicon layer by an insulator, and an overlying metal layer separated from the second polysilicon layer by an insulator. The metal layer provides a shield that is connected to a known voltage, or to the first polysilicon layer. When connected to the first polysilicon layer, the overlying metal layer also provides additional parallel capacitance, thereby reducing the integrated circuit area of the capacitor. In one example, the overlying metal layer is a second metal layer that is also used, together with a first metal layer, for interconnecting IC components.

19 Claims, 11 Drawing Sheets

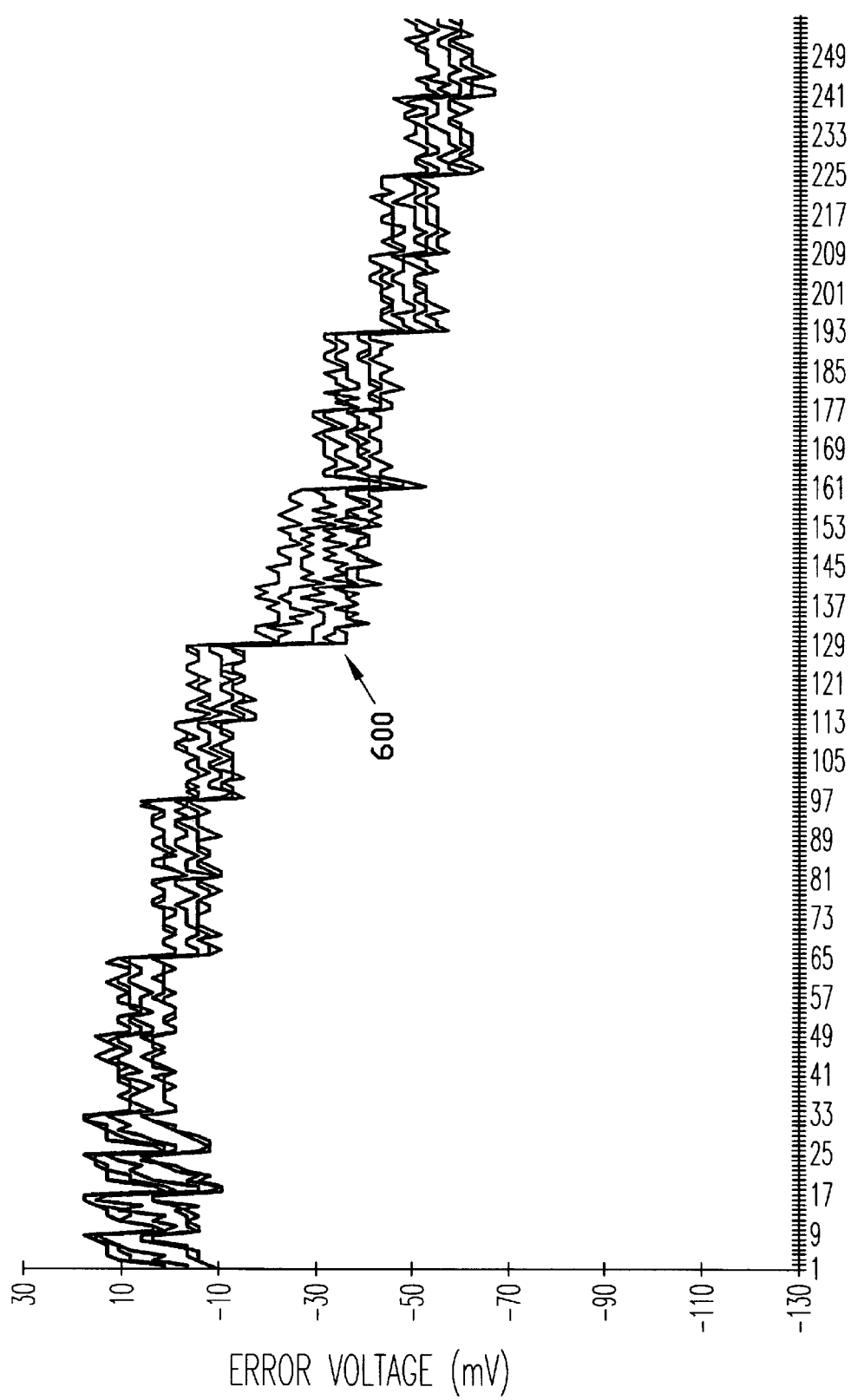

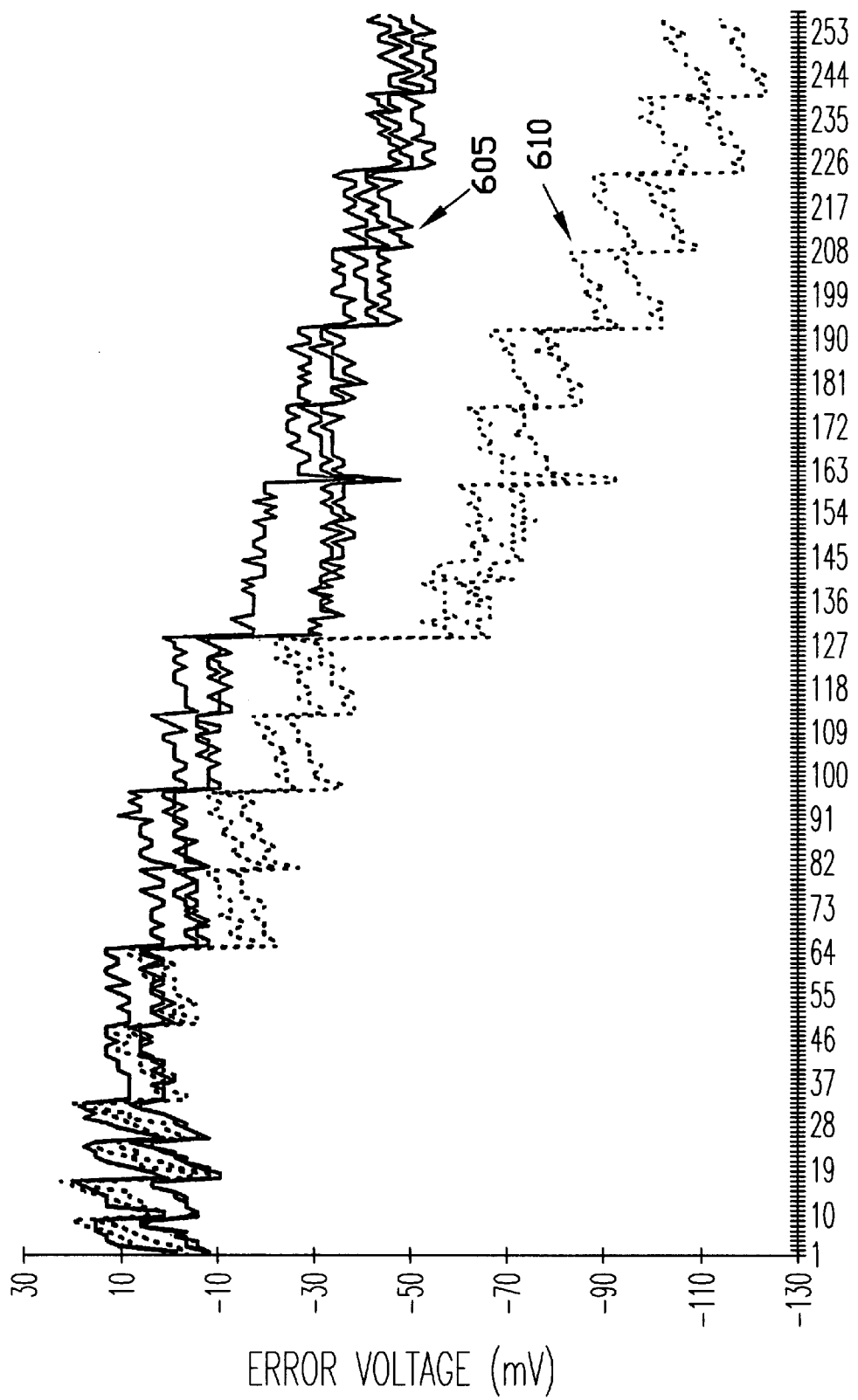

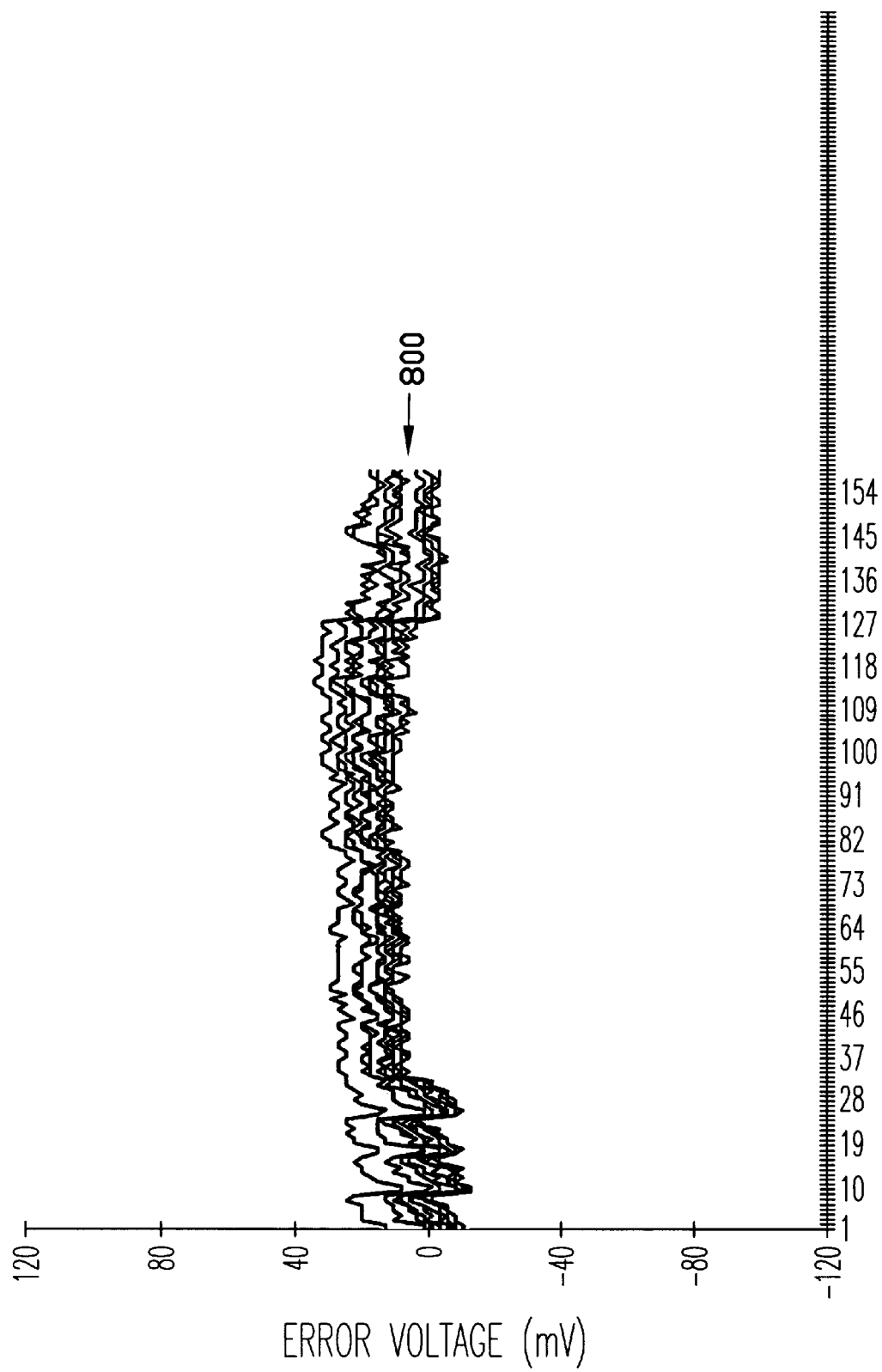

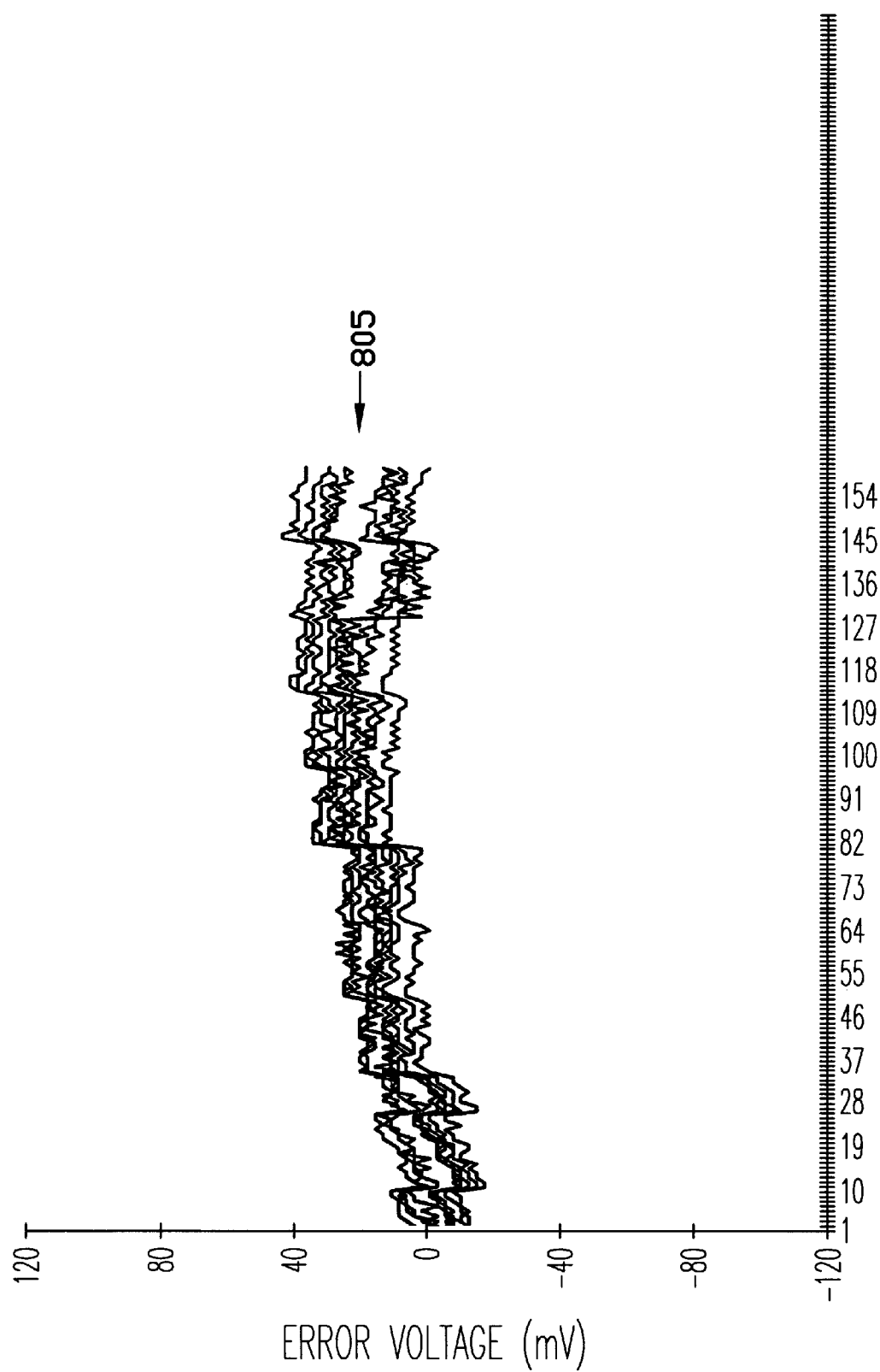

SHIELDED INTEGRATED CIRCUIT CAPACITOR CONNECTED TO A LATERAL TRANSISTOR

TECHNICAL FIELD OF THE INVENTION

This invention relates generally to integrated circuits, and particularly, but not by way of limitation, to a shielded-integrated circuit capacitor that is less sensitive to parasitic capacitances from overlying dielectrics.

BACKGROUND OF THE INVENTION

The implementation of complex signal processing functionality on an integrated circuit requires a variety of circuit elements, such as transistors, resistors, and capacitors. Some integrated circuit fabrication processes provide a "precision" capacitor for uses including switched-capacitor filters, digital-to-analog converters (DACs), and analog-to-digital converters (ADCs), such as in telecommunications, implantable medical devices, and other applications.

One integrated circuit capacitor includes separately formed conductive polysilicon layers having an insulator interposed therebetween. The first-formed polysilicon layer is referred to as the bottom plate of the capacitor, and the second-formed polysilicon layer is referred to as the top plate of the capacitor. The bottom plate is formed over the integrated circuit semiconductor substrate, and is separated therefrom by an insulator. Connection is made to each of the bottom and top plates by contact and metal layers. A protective passivation layer is formed over the top plate of the capacitor and the entire integrated circuit.

The above-described capacitor structure includes an unwanted parasitic capacitor, consisting of the bottom plate and substrate as parasitic capacitor terminals, and the insulator between the bottom plate and substrate as a parasitic capacitor dielectric. The unwanted parasitic capacitor, which is referred to as the bottom plate parasitic capacitor, can have a capacitance value that is approximately 10% of the capacitance value of the desired capacitor. As a result, designers of switched-capacitor integrated circuits adopt circuit designs that are insensitive to the bottom plate parasitic capacitor.

The above-described capacitor structure also includes a second unwanted parasitic capacitor, consisting of the top plate as a first parasitic capacitor terminal and at least one other circuit node, such as the substrate, as a second parasitic capacitor terminal. Passivation and other insulating layers form a second parasitic capacitor dielectric. The second unwanted parasitic capacitor, which is referred to as a top plate parasitic capacitor, results from electric fields originating from the top plate, passing through the superjacent dielectric passivation layer and the air above the passivation layer, and terminating at the substrate or other circuit nodes. Although the dielectric passivation layer can have a significant premittivity, the air above the passivation layer has a low permittivity. As a result, the top plate parasitic capacitor typically has a capacitance value that is relatively small, and circuit designs may be relatively unaffected by the top plate parasitic capacitor.

However, manufacturers of electronic devices using integrated circuits often require an additional coating over the passivation layer of the integrated circuit die. Such die coatings provide encapsulation of the integrated circuit die, resulting in numerous practical advantages. For example, a die coating may provide opacity so that the underlying semiconductor integrated circuit is unaffected by incident light, such as during testing of the integrated circuit or otherwise. In another example, the die coating may be used to adhere other electronic components of an electronic system to the integrated circuit die.

Unfortunately, the materials used for integrated circuit die coatings (e.g., epoxy, polyamide, etc.) often have a large permittivity, thereby increasing the value of the unwanted top plate parasitic capacitor. These die coatings are relatively thick and replace the low-permittivity air space above the die. As a result, the electric fields of the top plate parasitic capacitor pass through the superjacent dielectric passivation layer and the die coating above the passivation layer. Since both the passivation layer and die coating have a high permittivity, the capacitance value of the unwanted top plate parasitic capacitor increases, resulting in deleterious effects on circuit operation.

For example, the increased top plate parasitic capacitance can introduce nonlinearity in a digital-to-analog converter. Furthermore, since the die coating process may not be well-controlled, the die coating thickness may vary between capacitors on the same integrated circuit die as well as between different integrated circuit die. Such variations in die coating thickness introduce variations in top plate parasitic capacitance values. The increased top plate parasitic capacitance values and variations thereof are difficult to correct for using traditional digital-to-analog converter calibration and compensation techniques.

For these reasons, and other reasons that will become apparent upon reading the following detailed description of the invention, there is a need for providing an integrated circuit capacitor that is insensitive to parasitic capacitances, particularly those parasitic capacitors introduced by overlying dielectric layers. There is also a need for reducing the integrated circuit die area of the capacitor. There is a further need for improving the operation of digital-to-analog converters, analog-to-digital converters, switched-capacitor filters, and other signal processing circuits, by reducing the sensitivity of such circuits to parasitic capacitances, signal crosstalk, and external noise.

SUMMARY OF THE INVENTION

The present invention provides an integrated circuit capacitor for use in digital-to-analog converters, analog-to-digital converters, switched-capacitor filters, and other integrated circuit signal processing circuits. According to one aspect of the invention, the capacitor is relatively insensitive to unwanted parasitic capacitances, including such unwanted parasitic capacitances resulting from overlying dielectrics. Another aspect of the invention provides a reduced-size capacitor. Yet another aspect of the invention provides a capacitor having increased immunity to signal crosstalk and external noise.

The integrated circuit capacitor includes a first, second, and third conductors and first, second, and third insulators. The first conductor is formed on a substrate, but separated from the substrate by a first insulator. The second conductor, which provides a second terminal of the capacitor, is separated from the first conductor by a second insulator. The third conductor is separated from the second conductor by a third insulator. In one embodiment, the first conductor is electrically coupled to the third conductor for providing a first terminal of the capacitor.

Another embodiment of the present invention provides an integrated circuit, formed on a substrate. The integrated circuit includes a plurality of transistors and a capacitor, having first and second terminals and shield. A first polysilicon layer, forms gate regions of the transistors and the first terminal of the capacitor. A first metal interconnection layer interconnects ones of the transistors. A second metal interconnection layer is formed outwardly from the first metal interconnection layer. Together with the first metal interconnection layer, the second metal interconnection layer interconnects particular transistors. The second metal interconnection layer also forms the shield of the capacitor. A second polysilicon layer is interposed between at least part of the first polysilicon layer and the shield. The second polysilicon layer is separated from each of the first polysilicon layer and the shield by an insulator. The second polysilicon layer forms the second terminal of the capacitor.

Another aspect of the present invention includes a method of providing an integrated circuit capacitance between first and second terminals. In one embodiment, a first conductor is formed, separated from the substrate by a first insulator. A second conductor is formed, for providing the second terminal. The second conductor is separated from the first conductor by a second insulator. A third conductor is formed, separated from the second conductor by a third insulator. In one embodiment, the first and third conductors are electrically coupled to each other for providing the first terminal.

Another aspect of the present invention includes a method of fabricating an integrated circuit. In one embodiment, a first polysilicon layer is formed. Gate regions of a plurality of transistors and the first terminal of a capacitor are formed from the first polysilicon layer. A second polysilicon layer is formed outward from the first polysilicon layer. A second terminal of the capacitor is formed from the second polysilicon layer. First and second metal layers are respectively formed. Ones of the transistors are interconnected using the first and second metal layers. A capacitor shield is formed, outward from the second terminal of the capacitor, using the second metal interconnection layer. In one embodiment, the shield is electrically coupled to the first terminal of the capacitor.

Another aspect of the invention includes several methods of using an integrated circuit capacitor. In one embodiment, in which the capacitor has a first terminal, a second terminal formed outward from the first terminal, and a shield formed outward from the second terminal, a first voltage is provided to each of the first terminal and the shield, and a second voltage is provided to the second terminal. In another embodiment, in which the capacitor has a first terminal, a second terminal formed outward from the first terminal, and a shield formed outward from the second terminal, a first voltage is provided to the first terminal and a second voltage is provided to each of the second terminal and the shield. In a further embodiment, in which the capacitor has a first terminal, a second terminal formed outward from the first terminal, and a shield formed outward from the second terminal, a first voltage is provided to the first terminal, a second voltage is provided to the second terminal, and a stable reference voltage is provided to the shield.

As described in the following detailed description of the invention, various embodiments of the integrated circuit capacitor of the present invention offers reduced sensitivity to parasitic capacitance, reduced-size, and increased noise immunity.

BRIEF DESCRIPTION OF THE DRAWINGS

In the drawings, like numerals describe substantially similar components throughout the several views.

FIGS. 6A and 6B are graphs of error voltage (in milliVolts) vs. code value for a digital-to-analog converter (DAC) using a prior art capacitor.

FIGS. 8A and 8B are graphs of error voltage (in milliVolts) vs. code value for a DAC using one embodiment of a capacitor according to the present invention.

DETAILED DESCRIPTION OF THE INVENTION

Figure 1:
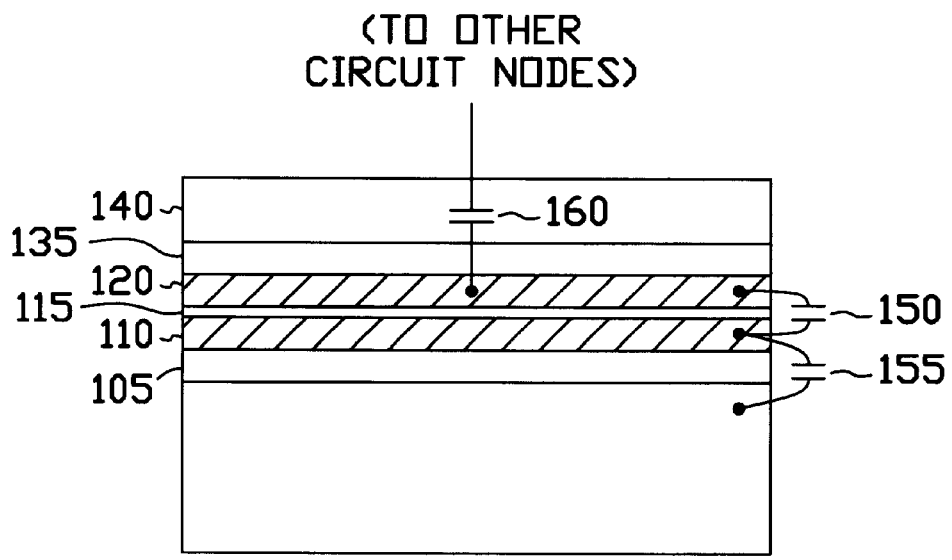
FIG. 1 is a combined schematic and cross-sectional view, labeled prior art, illustrating a conventional integrated circuit capacitor.

In the following detailed description of the invention, reference is made to the accompanying drawings which form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The terms wafer and substrate used in the following description include any structure having an exposed surface with which to form the integrated circuit structure of the invention. The term substrate is understood to include semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art. The term conductor is understood to include semiconductors, and the term insulator is defined to include any material that is less electrically conductive than the materials referred to as conductors. The following detailed description is, therefore, not to be taken in a limiting sense, and the scope of the present invention is defined only by the appended claims, along with the full scope of equivalents to which such claims are entitled.

The present invention provides an integrated circuit capacitor for use in digital-to-analog converters, analog-to-digital converters, switched-capacitor filters, and other signal processing circuits. According to one aspect of the invention, the capacitor is relatively insensitive to unwanted parasitic capacitances, including such unwanted parasitic capacitances resulting from overlying dielectrics. Another aspect of the invention provides a reduced-size capacitor.

Yet another aspect of the invention provides a capacitor having increased immunity to signal crosstalk and external noise. Other advantages will also become apparent upon reading the following detailed description of the invention.

FIG. 1 is a combined schematic and cross-sectional view, labeled prior art, illustrating a conventional integrated circuit capacitor 150. A first terminal of capacitor 150 is provided by a polysilicon bottom plate 110, which is formed over substrate 100. Bottom plate 110 is separated from substrate 100 by insulator 105. A second terminal of capacitor 150 is provided by a polysilicon top plate 120, which is formed over bottom plate 110. Top plate 120 is separated from bottom plate 110 by insulator 115. A passivation layer 135 is formed over top plate 120. An optional die coating, such as encapsulant 140, is formed over passivation layer 135. FIG. 1 also schematically illustrates capacitor 150, the above-described unwanted bottom plate parasitic capacitance 155, and the above-described unwanted top plate capacitance 160. The unwanted top plate capacitance 160 is between top plate 120 and any other circuit node or nodes. As described above, the unwanted top plate capacitance 160 exists regardless of whether or not encapsulant 140 is present, but its capacitance value increases when high permittivity encapsulant 140 is present rather than low permittivity air. The effects of bottom plate parasitic capacitance 155 can be minimized by known circuit design techniques.

Figure 2:
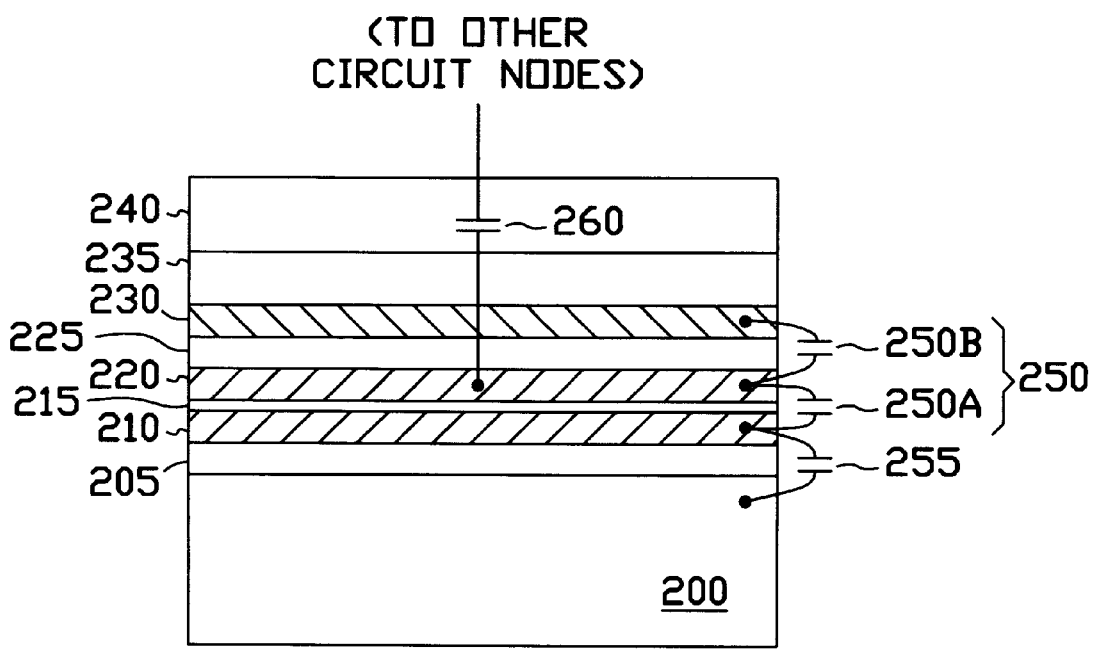
FIG. 2 is a combined schematic and cross-sectional view illustrating generally one embodiment of a capacitor according to the present invention.

FIG. 2 is a combined schematic and cross-sectional view illustrating generally by way of example, but not by way of limitation, one embodiment of a portion of the present invention and its environment. FIG. 2 includes a semiconductor or other substrate 200. In one embodiment, substrate 200 is a lightly-doped p_ bulk silicon semiconductor. In other embodiments, substrate 200 is a semiconductor-on-insulator (SOI) or a lightly-doped epitaxial layer formed on an underlying more heavily doped semiconductor, or any other suitable substrate. A first insulator 205 is formed on substrate 200. In one embodiment, first insulator 205 includes thermally grown silicon dioxide. A first conductor 210 is formed on first insulator 205. In one embodiment, first conductor 210 includes conductively doped polycrystalline silicon (polysilicon). A second insulator 215 is formed on first conductor 210. In one embodiment, second insulator 215 includes silicon dioxide. A second conductor 220 is formed on second insulator 215. In one embodiment, second conductor 220 includes conductively doped polysilicon. Other layers are formed outwardly from second conductor 220, including, but not limited to, third insulator 225. In one embodiment, third insulator 225 includes insulating silicon dioxide. A third conductor 230 (also referred to as a shield) is formed over third insulator 225. In one embodiment, third conductor 230 includes a metal, such as aluminum. A protective passivation layer 235 is formed over third conductor 230. In one embodiment, passivation layer 235 includes silicon dioxide. A die coating such as encapsulant 240 is optionally formed over passivation layer 235. Various embodiments of encapsulant 240 include epoxies, polyamide, or any other die coating.

One aspect of the present invention provides capacitors 250A and 250B. First conductor 210, second insulator 215, and second conductor 220 respectively provide a first terminal, a capacitor dielectric, and a second terminal of capacitor 250A. Second conductor 220, third insulator 225, and third conductor 230 respectively provide a first terminal, a capacitor dielectric, and a second terminal of capacitor 250B. In one embodiment, capacitors 250A and 250B are used in parallel to form a reduced integrated circuit area capacitor 250 that is insensitive to any parasitic capacitance 260 resulting from overlying dielectric layers such as passivation layer 235 or encapsulant 240, or both. In one such embodiment, third conductor 230 and first conductor 210 are electrically interconnected, as described below. In another such embodiment, third conductor 230 and first conductor 210 are not electrically interconnected, but are instead driven to receive approximately the same voltage, such as by an amplifier or voltage follower circuit, also described below.

The unwanted top plate parasitic capacitor 160 accompanying prior art capacitor 150 does not affect capacitor 250 according to the present invention. More particularly, the problematic top plate parasitic capacitor 160 to substrate 100 of FIG. 1, which results from overlying dielectric layers, is advantageously transformed in FIG. 2 such that it appears in parallel with, and as part of, the desired capacitor 250 by providing a third conductor 230 that is electrically interconnected to, or driven to the same voltage as, first conductor 210. This also increases the effective capacitance value of capacitor 250, thereby requiring less integrated circuit area to obtain a particular capacitor value. In another embodiment, third conductor 230 is not electrically interconnected to first conductor 210, but third conductor 230 is instead driven to a known voltage such that underlying capacitor 250A is shielded from parasitic capacitance 260 from overlying passivation layer 235 or encapsulant 240.

Also, top plate 120 of prior art capacitor 150 is susceptible to noise resulting from capacitive coupling (crosstalk) from nearby integrated circuit wiring lines or external noise, such as received from other electronic components in the operating environment of the integrated circuit. Many complementary metal-oxide-semiconductor (CMOS) integrated circuit designs permit only one terminal of the capacitor to be driven by a low impedance voltage source, requiring the other terminal of the capacitor to be electrically coupled to a high input impedance amplifier. In order to minimize any capacitive voltage division resulting from the parasitic bottom plate capacitance 155, bottom plate 110 is typically driven by the low impedance voltage source, leaving top plate 120 electrically coupled to the high impedance node. As a result, top plate 120 is particularly sensitive to noise as well as to capacitive voltage division resulting from parasitic top plate capacitance 160.

By contrast, the capacitor 250 allows each of third conductor 230 and first conductor 210 to be driven by a relatively low impedance voltage source. If required by a particular circuit design, second conductor 220 is electrically coupled to a high impedance node, and is effectively shielded from crosstalk and external noise by electrically driven third conductor 230. Thus, the present invention advantageously provides a capacitor 250 or 250A having increased noise immunity.

Figure 3A:
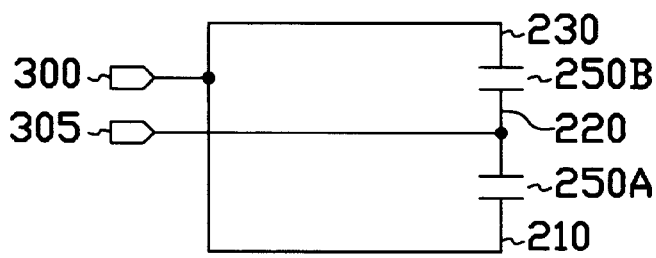
FIGS. 3A, 3B, 3C, and 3D are schematic diagrams illustrating generally several embodiments of capacitors according to the present invention.

FIGS. 3A, 3B, 3C, and 3D are schematic diagrams that illustrate generally, by way of example, but not by way of limitation, several embodiments of portions of the present invention. In FIG. 3A, third conductor 230 and first conductor 210 are electrically interconnected for providing a first terminal 300 of capacitor 250. Second conductor 220 is electrically interconnected for providing a second terminal 305 of capacitor 250. This embodiment provides reduced capacitor area, increased immunity to parasitic capacitances from overlying dielectrics, and reduced susceptibility to crosstalk and external noise.

Figure 3B:
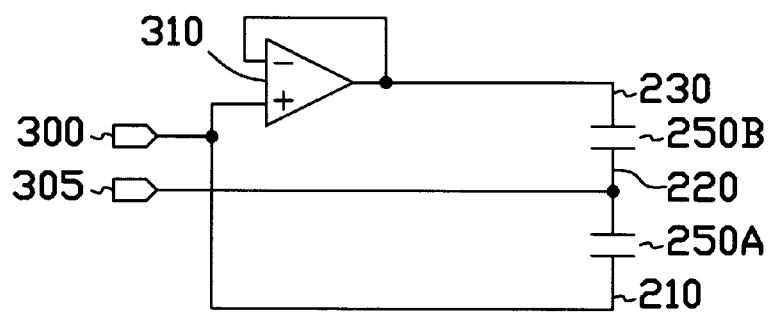

In FIG. 3B, third conductor 230 and first conductor 210 are each electrically interconnected to approximately the same voltage for providing a first terminal 300 of capacitor

250. In one embodiment, a low impedance voltage source, such as voltage follower 310, provides the voltage to one or both of third conductor 230 and first conductor 210. Second conductor 220 is electrically interconnected for providing a second terminal 305 of capacitor 250. This embodiment also provides reduced capacitor area, increased immunity to parasitic capacitances from overlying dielectrics, and reduced susceptibility to crosstalk and external noise.

Figure 3C:
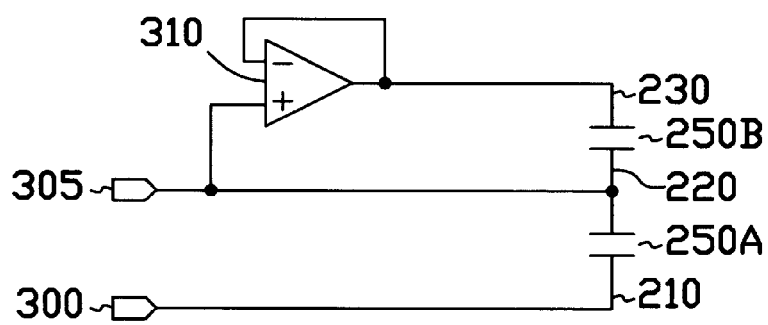

In FIG. 3C, first conductor 210 is electrically interconnected for providing a first capacitor terminal 300 of capacitor 250A. Second conductor 220 provides a second capacitor terminal 305 of capacitor 250A. Third conductor 230 provides a shield that is driven to approximately the same voltage as second conductor 220, such as by voltage follower 310. This embodiment provides increased immunity to parasitic capacitances from overlying dielectrics, and reduced susceptibility to crosstalk and external noise.

Figure 3D:
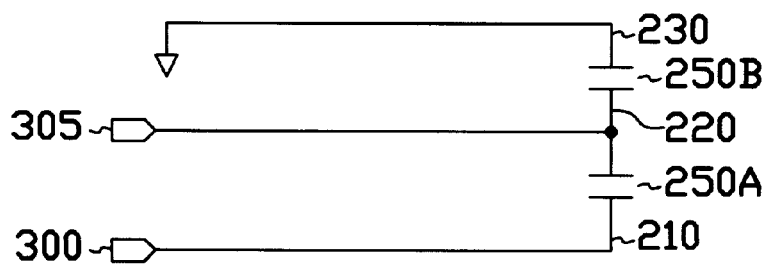

In FIG. 3D, first conductor 210 is electrically interconnected for providing a first capacitor terminal 300 of capacitor 250A. Second conductor 220 provides a second capacitor terminal 305 of capacitor 250A. Third conductor 230 provides a shield that is driven to a ground voltage or any other stable reference voltage. This embodiment provides increased immunity to parasitic capacitances from overlying dielectrics, and reduced susceptibility to crosstalk and external noise.

Figure 4A:
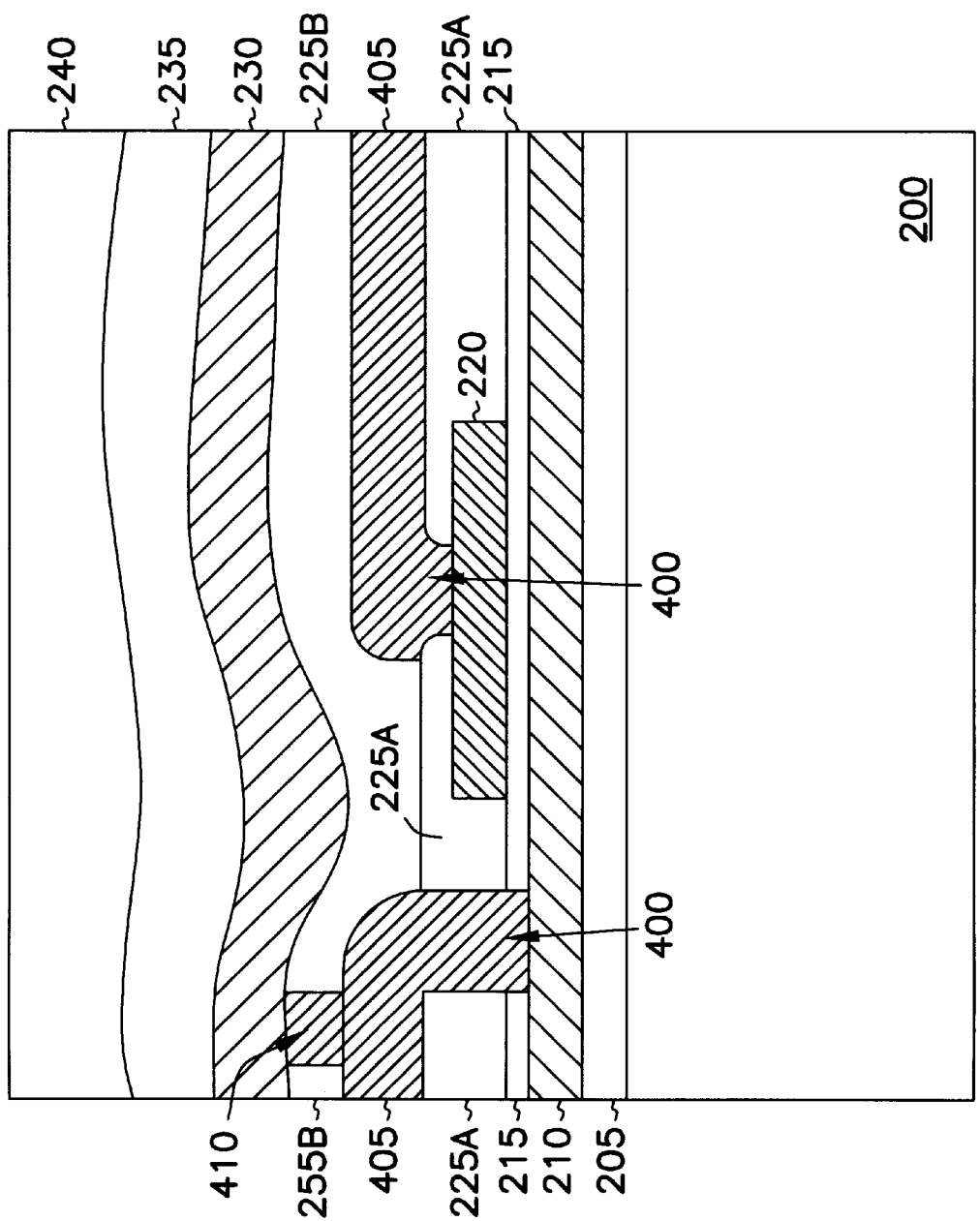
FIG. 4A is a cross-sectional view illustrating generally one embodiment of a capacitor according to the present invention and its environment.

FIG. 4A is a cross-sectional view illustrating generally by way of example, but not by way of limitation, one embodiment of a portion of the present invention and its environment. In FIG. 4A, third insulator 225 is separately formed as insulator 225A and insulator 225B. First, insulator 225A is formed over second conductor 220. Contacts 400 are selectively formed through insulator 225A, and any underlying portions of second insulator 215. A conductive layer, such as metal layer 405, is formed over insulator 225A and within contacts 400. Metal layer 405 is selectively removed to provide electrical interconnections to first conductor 210 and second conductor 220. In one embodiment, metal layer 405 also forms electrical interconnections between transistors and other circuit components fabricated on the same integrated circuit. Insulator 225B is formed on metal layer 405. Third conductor 230 is formed on insulator 225B, and selectively patterned. In one embodiment, third conductor 230 is a metal layer that, together with metal layer 405, also provides electrical interconnections between transistors and other circuit components fabricated on the same integrated circuit.

In one embodiment, in which first conductor 210 and third conductor 230 are electrically interconnected, via 410 is selectively formed through insulator 225B before third conductor 230 is formed, such that a portion of third conductor 230 fills via 410. In embodiments in which first conductor 210 and third conductor 230 are not electrically interconnected (See e.g., FIGS. 3B, 3C, and 3D), via 410 is omitted.

Figure 4B:
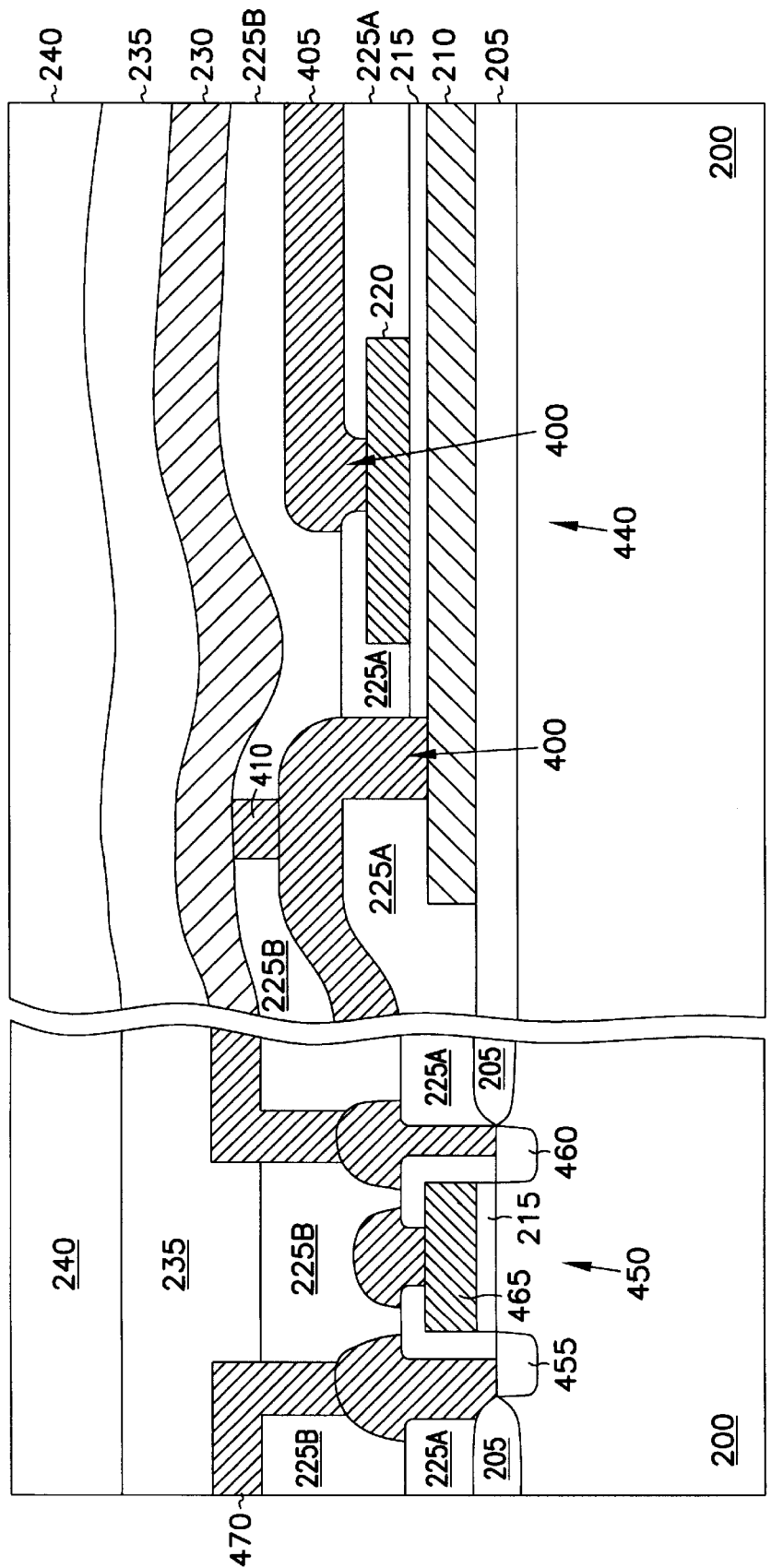
FIG. 4B is a cross-sectional view illustrating generally one embodiment of a capacitor according to the present invention together with a transistor fabricated on the same integrated circuit.

FIG. 4B is a cross-sectional view illustrating generally by way of example, but not by way of limitation, one embodiment of a portion of a capacitor 440 according to the present invention on the same integrated circuit with other transistors such as field-effect transistor 450. Transistor 450 includes source 455 and drain 460 diffusions and polysilicon gate 465. In this embodiment, polysilicon gate 465 is formed from the same layer as first conductor 210. Transistor 450 is interconnected with other transistors, such as by first metal layer 405, vias 410, and metal layer 470. In this embodiment, metal layer 470 is formed from the same layer as third conductor 230.

Figure 5A:
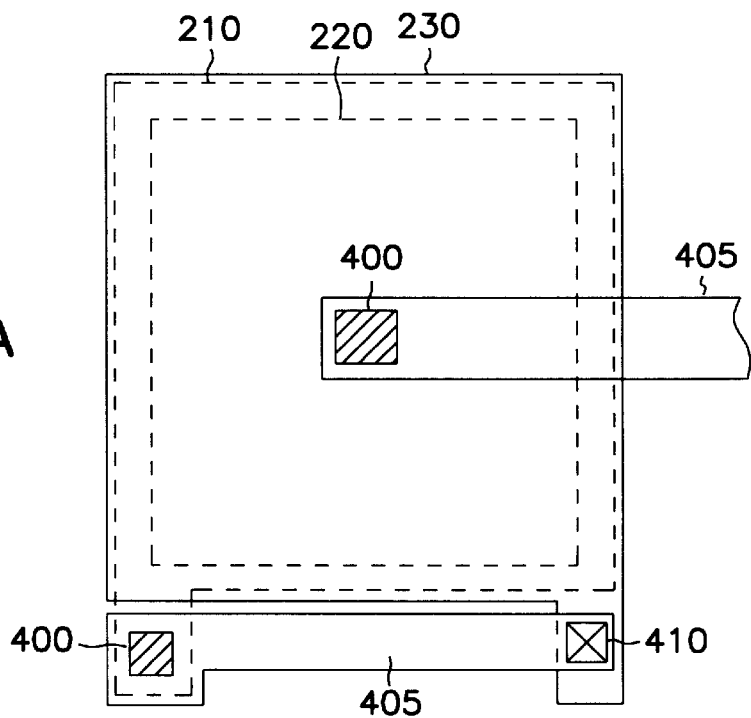
FIGS. 5A and 5B are plan views illustrating generally several embodiments of portions of a capacitor according to the present invention.
Figure 5B:
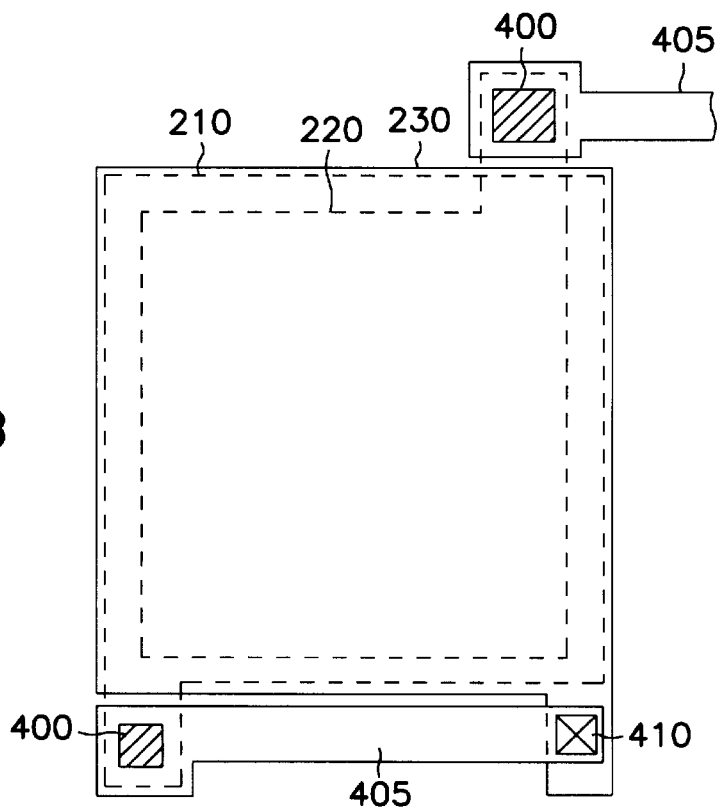

FIGS. 5A and 5B are plan views that illustrate generally, by way of example, but not by way of limitation, several embodiments of portions of a capacitor according to the present invention. In FIG. 5A, first conductor 210 is patterned into a polygon, such as a square having an extension for forming a contact 400 thereto. Second conductor 220 is patterned into a polygon, such as a square, that is substantially enclosed by the polygon of first conductor 210. Third conductor 230 is patterned into a polygon, such as a square. In one embodiment, the polygon of third conductor 230 is in substantial registration with the polygon of first conductor 210, with only a slight overlap or underlap thereto. Third conductor 230 includes an extension for filling underlying via 410. In one embodiment, separately patterned portions of metal layer 405 provide electrical interconnections, such as between via 410 and the contact 400 to first conductor 210, and to second conductor 220 through contact the 400 thereto.

FIG. 5B is similar to FIG. 5A, with one difference being that in FIG. 5B, the patterned polygon formed by second conductor 220 includes an extension for forming a contact 400 thereto, wherein the contact 400 is outside the areas enclosed by the polygons provided by first conductor 210 and third conductor 230. FIGS. 5A and 5B provide useful illustrative examples, but other arrangements of forming a capacitor according to the present invention are also possible.

FIGS. 5A and 5B illustrate, by way of example, unit capacitors, such as are typically used in switched-capacitor integrated circuit designs. Other capacitance values are obtained by interconnecting ones of the unit capacitors in parallel. However, it is understood that the above-described techniques of the present invention are not limited to application in unit capacitors, but are also applicable to any arbitrarily-shaped integrated circuit capacitor. It is also understood that in certain embodiments of practicing the invention, a unitary portion of third conductor 230 is shared by multiple unit capacitors, whether or not such unit capacitors are wired in parallel, such as, for example, in the circuit embodiment illustrated in FIG. 3D. In other embodiments of practicing the invention, a uniquely formed portion of third conductor 230 is provided for each unit capacitor, such as, for example, in the circuit embodiment illustrated in FIG. 3A.

FIGS. 6A and 6B are graphs of error voltage (in milliVolts) vs. code value for an 8-bit (e.g., having 0–255 digital codes) subranging switched-capacitor digital-to-analog converter (DAC) using the prior art capacitor 150 of FIG. 1. In FIG. 6A, the solid lines, labeled 600, illustrate data from 5 different DACs, none of which are coated with a die coating. In FIG. 6B, the solid lines, labeled 605, illustrate data from 3 of the same DACs, none of which are coated with a die coating. The dashed lines, labeled 610, illustrate data from the other 2 DACs, each of which are coated with a thermal plastic encapsulant 140. As seen in FIGS. 6A and 6B, the absolute error voltage can be as large as approximately 60 mV for the uncoated parts illustrated by lines 600 and 605, and as large as approximately 120 mV for the coated parts illustrated by lines 610.

Figure 7A:
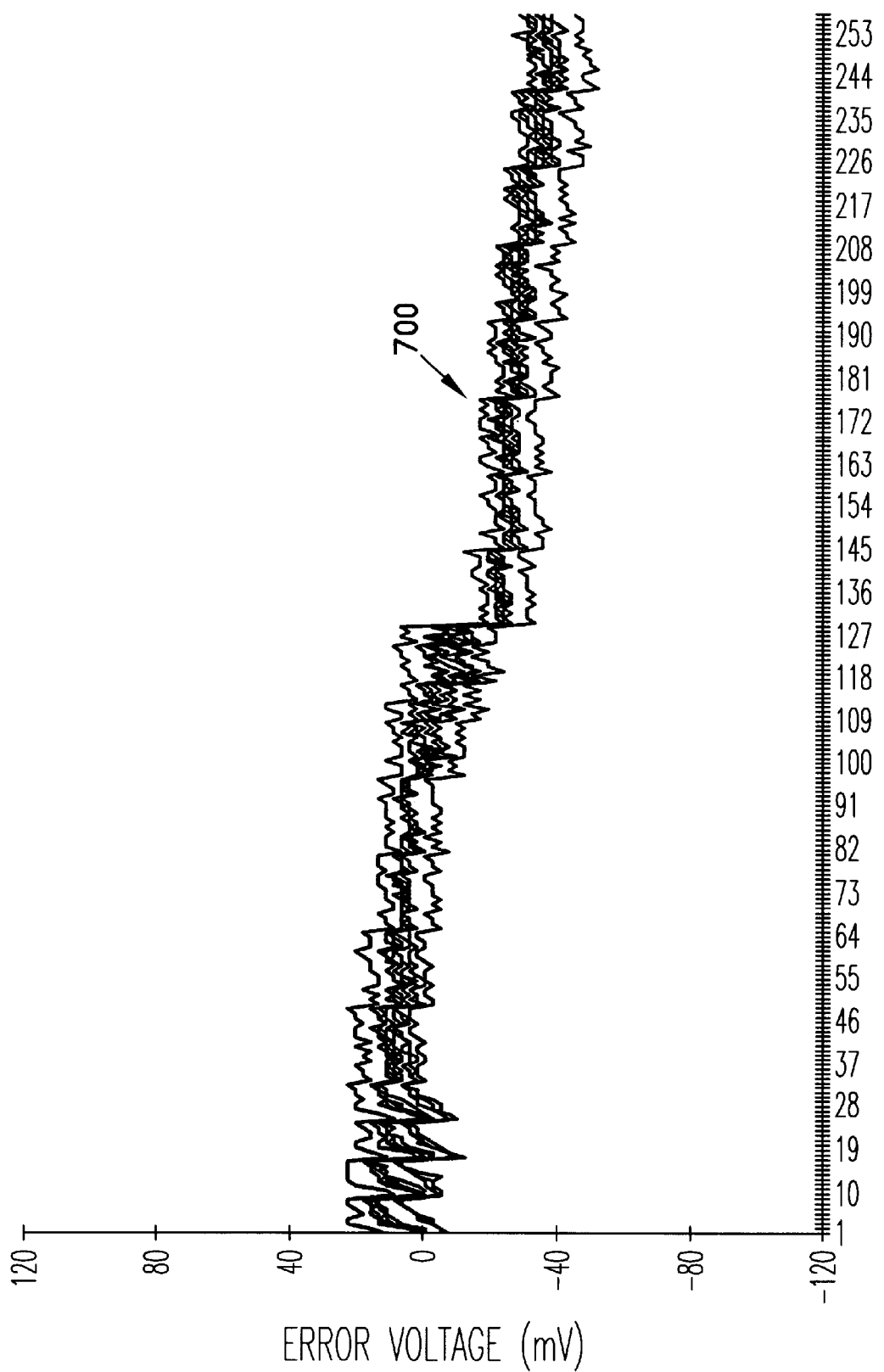
FIGS. 7A and 7B are graphs of error voltage (in milliVolts) vs. code value for a DAC using one embodiment of a capacitor according to the present invention.
Figure 7B:
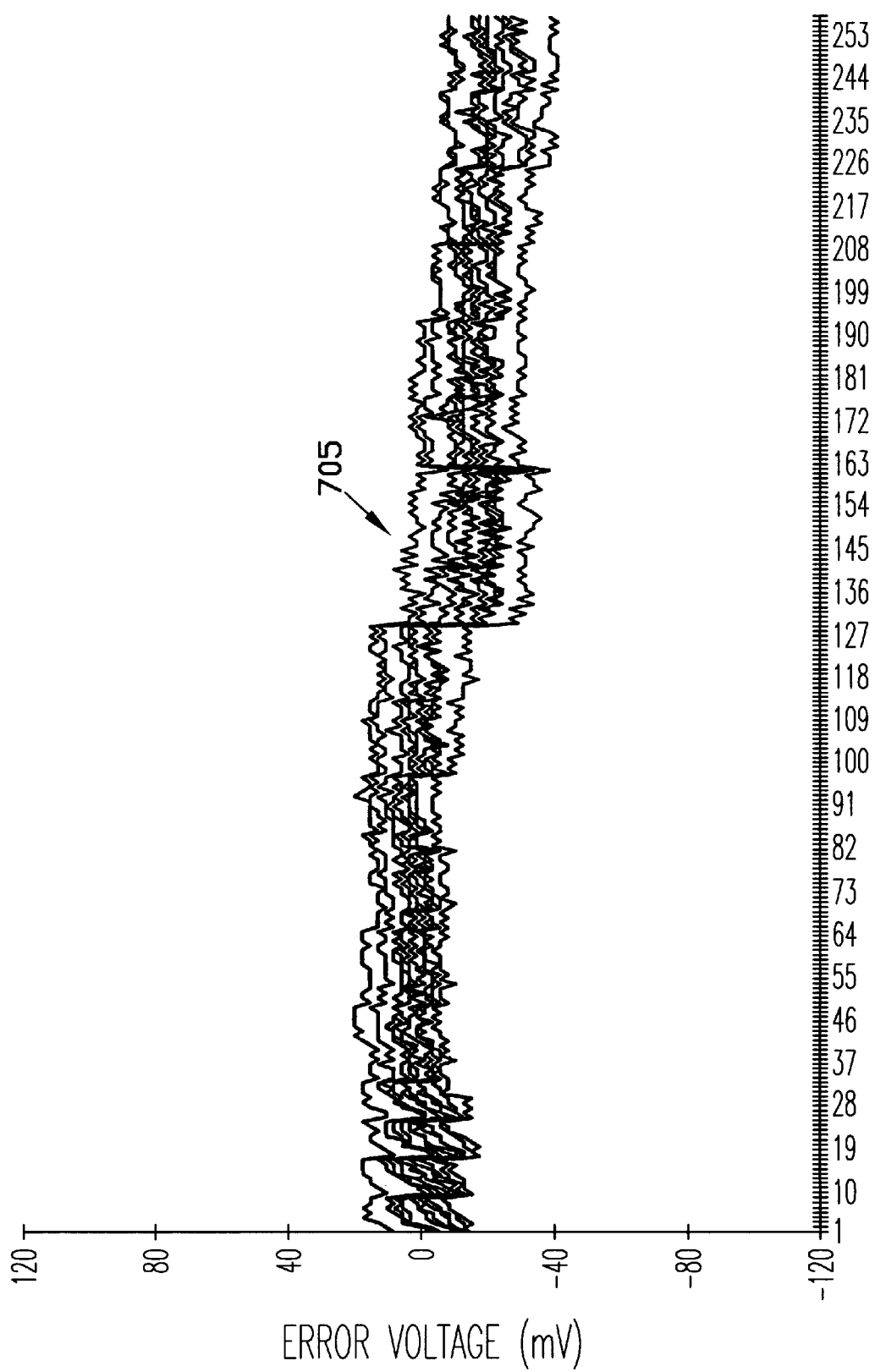

FIGS. 7A and 7B are graphs of error voltage (in milliVolts) vs. code value for an 8-bit (e.g., having 0–255 digital codes) subranging switched-capacitor digital-to-analog converter (DAC) using the capacitor 250 of FIG. 2 according to one aspect of the present invention. In FIGS. 7A and 7B, the DAC uses unit capacitors 250 that are similar to the unit capacitor illustrated in FIG. 5B. In FIG. 7A, the solid lines, labeled 700, illustrate data from 10 different DACs, none of which are coated with a die coating. In FIG. 7B, the solid lines, labeled 705, illustrate data from the same 10 DACs after coating with a conductive epoxy die coating, which ordinarily induces more parasitic capacitance than the thermal plastic die coating of FIG. 6B. As seen in FIGS. 7A and 7B, the absolute error voltage can be as large as approximately 50 mV for the coated parts illustrated by lines 705, which do not differ significantly from uncoated parts illustrated by lines 700.

FIGS. 8A and 8B are graphs of error voltage (in millivolts) vs. code value for an 8-bit (e.g., having 0–255 digital codes) subranging switched-capacitor digital-to-analog converter (DAC) using the capacitor 250 of FIG. 2 according to the present invention. In FIGS. 8A and 8B, the DAC uses unit capacitors 250 that are similar to the unit capacitor illustrated in FIG. 5B, except that the polygon formed by third conductor 230 is shared in common by all unit capacitors in the DAC and electrically coupled to a reference voltage (e.g., grounded). In FIG. 8A, the solid lines, labeled 800, illustrate data from 10 different DACs, none of which are coated with a die coating. In FIG. 8B, the solid lines, labeled 805, illustrate data from the same 10 DACs after coating with a conductive epoxy die coating, which ordinarily induces more parasitic capacitance than the thermal plastic die coating of FIG. 6B. As seen in FIGS. 8A and 8B, the absolute error voltage can be as large as approximately 40 mV for the coated parts illustrated by lines 805, which do not differ significantly from the uncoated parts illustrated by lines 800. It should be noted that in FIGS. 8A and 8B, data from only approximately 160 of the 256 digital codes was obtainable.

CONCLUSION

As described above, the present invention provides, among other things, an integrated circuit capacitor for use in digital-to-analog converters, analog-to-digital converters, switched-capacitor filters, and other signal processing circuits. According to one aspect of the invention, the capacitor is relatively insensitive to unwanted parasitic capacitances, including such unwanted parasitic capacitances resulting from overlying dielectrics. Another aspect of the invention provides a reduced-size capacitor. Yet another aspect of the invention provides a capacitor having increased immunity to signal crosstalk and external noise.

It is to be understood that the above description is intended to be illustrative, and not restrictive. Many other embodiments will be apparent to those of skill in the art upon reviewing the above description. The scope of the invention should, therefore, be determined with reference to the appended claims, along with the full scope of equivalents to which such claims are entitled.

What is claimed is:

1. An integrated circuit comprising one or more transistors and one or more capacitors formed on a substrate, with each capacitor comprising:
   a first insulator, formed on the substrate;
   a conductive first capacitor plate, separated from the substrate by the first insulator, with the first capacitor plate not being a gate for any one of the transistors;
   a second insulator, formed on the first capacitor plate;
   a conductive second capacitor plate formed on the second insulator, separated from the first capacitor plate by the second insulator, and electrically connected to at least one of the transistors, with the one transistor being a lateral transistor;
   a third insulator, formed on the second capacitor plate;
   a conductive third capacitor plate, formed on the third insulator and separated from the second capacitor plate by the third insulator; and
   a conductive interconnector electrically coupling the first and third capacitor plates.

2. The capacitor of claim 1, wherein at least one of the first and second capacitor plates comprises polysilicon and wherein the conductive interconnector extends through respective openings in the second and third insulators.

3. The capacitor of claim 1, wherein the third capacitor plate comprises a metal.

4. The capacitor of claim 1, wherein at least one of the first, second, and third insulators comprises silicon dioxide.

5. An integrated circuit comprising one or more transistors and one or more capacitors on a semiconductor substrate, with each capacitor comprising:
   a field oxide, formed on the substrate;
   a polysilicon first conductor, formed on the field oxide;
   a gate oxide, formed on the polysilicon first conductor;
   a polysilicon second conductor, formed on the gate oxide and electrically connected to at least one of the transistors, with the one transistor being a non-vertical transistor;
   an interlayer third insulator, formed on the polysilicon second conductor;
   a metal shield, formed on the interlayer third insulator; and
   an electrical interconnector connecting the metal shield and the polysilicon first conductor.

6. The capacitor of claim 5, wherein the electrical interconnector comprises:
   a metal conductor extending through respective openings in the interlayer third insulator and the gate oxide.

7. An integrated circuit, formed on a substrate, the integrated circuit comprising:
   a plurality of lateral transistors;
   a capacitor, having first and second terminals and a shield;
   a first polysilicon layer, portions of the first polysilicon layer forming gate regions of the transistors and the first terminal of the capacitor;
   a first metal interconnection layer;
   a second metal interconnection layer, formed outwardly from the first metal interconnection layer and the first polysilicon layer, and, portions of the first metal interconnection layer coupled to portions of the second metal interconnection layer, portions of the first and second metal interconnection layers interconnecting one of the transistors, wherein a portion of the second metal interconnection layer forms the shield of the capacitor; and
   a second polysilicon layer, a portion of the second polysilicon layer interposed between at least part of the first polysilicon layer and the shield, the portion of the second polysilicon layer separated from each of the part of the first polysilicon layer and the shield by an insulator, and the portion of the second polysilicon layer forming the second terminal of the capacitor and electrically connected to at least one of the transistors.

8. The integrated circuit of claim 7, wherein the shield is electrically coupled to the first terminal of the capacitor.

9. The integrated circuit of claim 7, wherein the shield is electrically coupled to receive a reference potential.

10. The integrated circuit of claim 7, wherein the shield is electrically coupled to the substrate.

11. The integrated circuit of claim 7, wherein each of the first terminal of the capacitor and the shield are electrically coupled for receiving approximately equal voltages.

12. The integrated circuit of claim 7, wherein each of the second terminal of the capacitor and the shield are electrically coupled for receiving approximately equal voltages.

13. A method of providing an integrated circuit capacitance between first and second terminals, the method comprising:

forming a conductive first capacitor plate, separated from the substrate by a first insulator;

forming a conductive second capacitor plate, for providing the second terminal, wherein the second capacitor plate is separated from the first capacitor plate by a second insulator;

electrically coupling the second capacitor plate to one or more lateral transistors formed on the substrate;

forming a contact opening in the second insulator;

forming a conductive third capacitor plate, separated from the second capacitor plate by a third insulator;

forming a via in the third insulator; and electrically coupling the first and third capacitor plates for providing the first terminal by forming a metal interconnection extending through the contact and the via.

14. A method comprising:

providing an integrated circuit including at least one lateral transistor and a capacitor on a semiconductor substrate, with the capacitor having a first capacitor plate, a second capacitor plate formed outward from the first capacitor plate and connected at least to the one lateral transistor, and a conductive layer formed outward from the second capacitor plate, the conductive layer including a first portion providing a shield over the first and second capacitor plates and a second portion electrically isolated from the first portion;

interconnecting devices on the integrated circuit, which are different from the integrated circuit capacitor, using the second portion of the conductive layer;

providing a first voltage, to each of the first capacitor plate and the shield, through a metal interconnector that extends through a contact opening in a second insulator between the first and second capacitor plates and that also extends through a via opening in a third insulator between the second capacitor plate and the shield; and providing a second voltage to the second capacitor plate.

15. A method comprising:

providing an integrated circuit including at least one lateral transistor and a capacitor on a semiconductor substrate, with the capacitor having a first capacitor plate, a second capacitor plate formed outward from the first capacitor plate and connected at least to the one lateral transistor, and a conductive layer formed outward from the second capacitor plate, the conductive layer including a first portion providing a shield over the first and second capacitor plates and a second portion electrically isolated from the first portion;

interconnecting devices on the integrated circuit, which are different from the integrated circuit capacitor, using the second portion of the conductive layer;

providing a first voltage to the first capacitor plate; and providing a second voltage to each of the second capacitor plate and the conductive layer.

16. A method comprising:

providing an integrated circuit including at least one lateral transistor and a capacitor on a semiconductor substrate, with the capacitor having a first capacitor plate, a second capacitor plate formed outward from the first capacitor plate and connected at least to the one lateral transistor, and a conductive layer formed outward from the second capacitor plate, the conductive layer including a first portion providing a shield over the first and second capacitor plates and a second portion electrically isolated from the first portion;

interconnecting devices on the integrated circuit, which are different from the integrated circuit capacitor, using the second portion of the conductive layer;

providing a first voltage to the first capacitor plate;

providing a second voltage to the second capacitor plate; and providing a stable reference voltage to the conductive layer.

17. An integrated circuit comprising:

a substrate;

one or more lateral transistors, formed in and on the substrate;

a first insulator, formed on the substrate;

a capacitor, formed on the first insulator, the capacitor including:

a first capacitor plate patterned from a first conductive layer, the first capacitor plate formed on the first insulator;

a second insulator patterned from a second insulator layer, the second insulator of the capacitor formed on the first capacitor plate and including a contact opening;

a second capacitor plate patterned from a second conductive layer, the second capacitor plate providing a second terminal of the capacitor and electrically connected to at least one of the transistors, the second capacitor plate formed on the second insulator, separated from the first capacitor plate by the second insulator;

a third insulator, formed on the second conductor, the third insulator including a via through a portion of the third insulator;

a third capacitor plate patterned from a third conductive layer, the third capacitor plate formed on the third insulator and separated from the second capacitor plate by the third insulator; and an interconnector electrically coupling the first and third capacitor plates for providing a first terminal of the capacitor, wherein the interconnector extends through the contact opening in the second insulator and through the via in the third insulator.

18. An integrated circuit comprising one or more lateral transistors and one or more capacitors formed on a substrate, with each capacitor comprising:

first means, separated from the substrate, for functioning as a capacitor plate;

second means, separated from the first means, for functioning as a capacitor plate, with the second means electrically connected to at least one of the lateral transistors;

third means, separated from the second means, for functioning as a capacitor plate; and means for electrically coupling the first and third means.

19. The integrated circuit of claim 18 further including means for providing a voltage to at least one of the first, the second, or the third means.

* * * * *

UNITED STATES PATENT AND TRADEMARK OFFICE
CERTIFICATE OF CORRECTION

PATENT NO. : 6,198,123 B1
DATED : March 6, 2001
INVENTOR(S) : Linder et al.

Page 1 of 1

It is certified that error appears in the above-identified patent and that said Letters Patent is hereby corrected as shown below:

<u>Title page,</u>
Title, item [54], delete "CONNECTED TO A LATERAL TRANSISTOR".

<u>Column 1,</u>
Title, lines 2-3, delete "CONNECTED TO A LATERAL TRANSISTOR".
Line 54, delete "premittivity" and insert -- permitivitty --, therefor.

Signed and Sealed this

Thirteenth Day of November, 2001

Attest:

NICHOLAS P. GODICI
Attesting Officer    Acting Director of the United States Patent and Trademark Office